United States Patent [19]
Ying

[11] 3,864,819
[45] Feb. 11, 1975

[54] METHOD FOR FABRICATING SEMICONDUCTOR DEVICES

[75] Inventor: Robert S. Ying, Torrance, Calif.

[73] Assignee: Hughes Aircraft Co., Culver City, Calif.

[22] Filed: Sept. 29, 1971

[21] Appl. No.: 184,767

Related U.S. Application Data

[63] Continuation-in-part of Ser. No. 95,652, Dec. 7, 1970, abandoned.

[52] U.S. Cl. .................................... 29/583, 29/580
[51] Int. Cl. .................................... B01j 17/00
[58] Field of Search .................... 29/580, 590, 583

[56] References Cited

UNITED STATES PATENTS

| | | | |
|---|---|---|---|
| 2,444,255 | 6/1948 | Hewlett | 29/583 |
| 2,865,082 | 12/1958 | Gates | 29/580 |
| 3,193,418 | 7/1965 | Cooper et al. | 29/580 |
| 3,333,324 | 8/1967 | Roswell | 29/576 J |
| 3,562,057 | 2/1971 | McAlister | 29/583 |
| 3,675,314 | 7/1972 | Levi | 29/580 |
| 3,689,993 | 9/1972 | Tolar | 29/583 |
| 3,747,201 | 7/1923 | Arai | 29/580 |

*Primary Examiner*—Roy Lake
*Assistant Examiner*—W. Tupman

[57] ABSTRACT

A plurality of individual semiconductor devices are simultaneously produced by thinning a doped semiconductor wafer to a desired uniform thickness, thermocompression bonding the thinned semiconductor wafer to a metal support plate, etching the wafer into many tiny discrete members, and punching out small individual sections of the support plate, each section forming a heat sink and having one of the bonded semiconductor members thereon. Alternately, the semiconductor wafer may be thinned after the bonding step has been effected, although prior thinning is preferred.

15 Claims, 12 Drawing Figures

METHOD FOR FABRICATING SEMICONDUCTOR DEVICES

This is a continuation-in-part of copending U.S. Pat. application, Ser. No. 95,652, filed Dec. 7, 1970, for "Semiconductor Devices And Method Of Making Same", and now abandoned.

The present invention relates to the fabrication of small semiconductor devices and, more particularly, to an inexpensive method for simultaneously fabricating a plurality of such devices.

Small semiconductor devices are useful for a variety of functions, such as for use as PN diodes, PIN diodes, varactor diodes, IMPATT (impact avalanche ionization transit time) and TRAPATT (trapped plasma avalanche trigger transit) diodes, triodes, etc., and transistors. The primary function of IMPATT and TRAPATT diodes, when employed as avalanche diodes, is to generate and/or amplify microwave and millimeter wave signals. Several factors must be considered for the fabrication of these devices, namely, low cost, efficiency and power output, reliability, ease of packaging, high frequency operation, adaptability to various applications and to various circuits, e.g., coaxial, waveguide and microstrip.

The purpose of this invention is to provide a process for fabrication of such devices wherein all the above features are combined so that a high power and high efficiency packaged device can be produced in an economical fashion. As is known, such devices comprise a tiny, thin, semiconductor element affixed to a small metal plate. Because of their small size, they have been relatively difficult to fabricate and several techniques have been devised therefor. The two most common methods are infrared alignment to form a pill structure diode and double mask alignment to form a mesa structure diode which, in both cases, is thermocompression bonded with other individual diodes into a package. In both techniques, a small section is punched out of a copper plate and the tiny, thin, pre-shaped silicon semiconductor element is then thermocompression bonded to the small section. These techniques require separate assembling and bonding operations and, consequently, are tedious, time consuming, cumbersome, and therefore, expensive. In addition, because of handling difficulties, the diodes must be more than 50 microns thick. Since the active region of the device is only about 1 to 5 microns thick, the excess silicon thickness adds series loss and reduces the diodes rf performance. The packages used are also frequency limited because of high loss at higher frequencies and, therefore, they are not suitable to integrated microstrip circuit application.

The present invention avoids these and other problems by mass producing many such devices in a single operation. Briefly, a semiconductor wafer is thinned to a desired thickness and secured to a metal support plate. Alternatively, the wafer may be thinned after being secured to the plate. Thereafter, the wafer is etched into a plurality of discrete devices. The plate with each device is then subjected to a multiple, single step punching or dicing operation to form a plurality of individual devices.

It is, therefore, an object of the present invention to provide a method for mass producing small semiconductor devices.

Another object of the present invention is to provide a method for producing many small semiconductor devices each including a tiny, thin semiconductor element bonded to a small metal support member.

These and other objects and advantages of the present invention will become apparent from the following description and drawings of illustrative embodiment, wherein.

Figure 2:
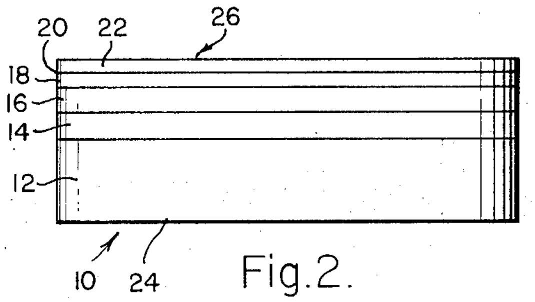
FIG. 2 depicts the wafer of FIG. 1 metallized on its upper doped surface.
Figure 3A:
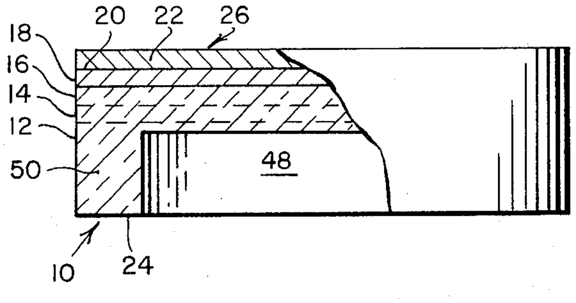
Figure 3B:
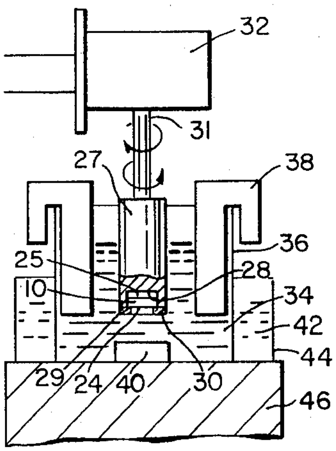
Figure 4A:
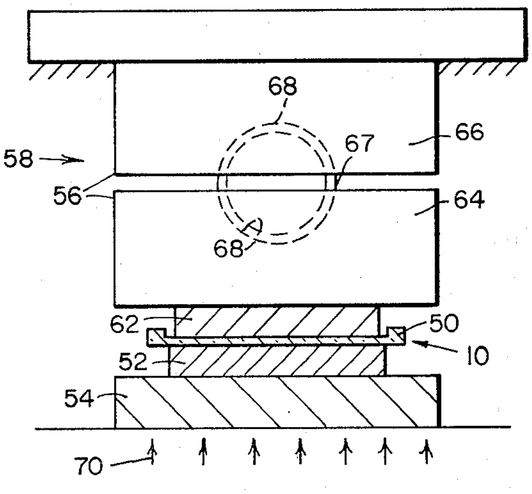
Figure 4B:
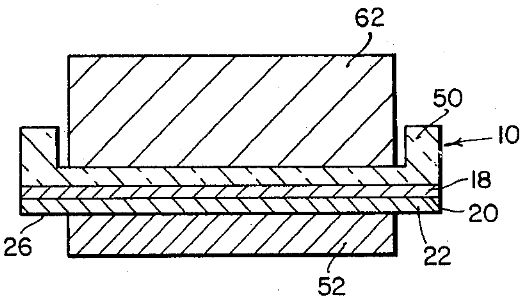
Figure 5:
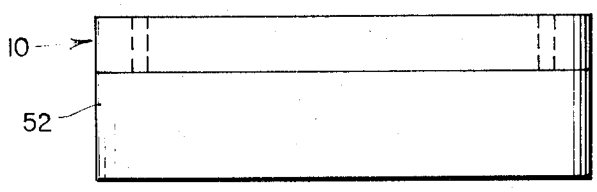
Figure 8:
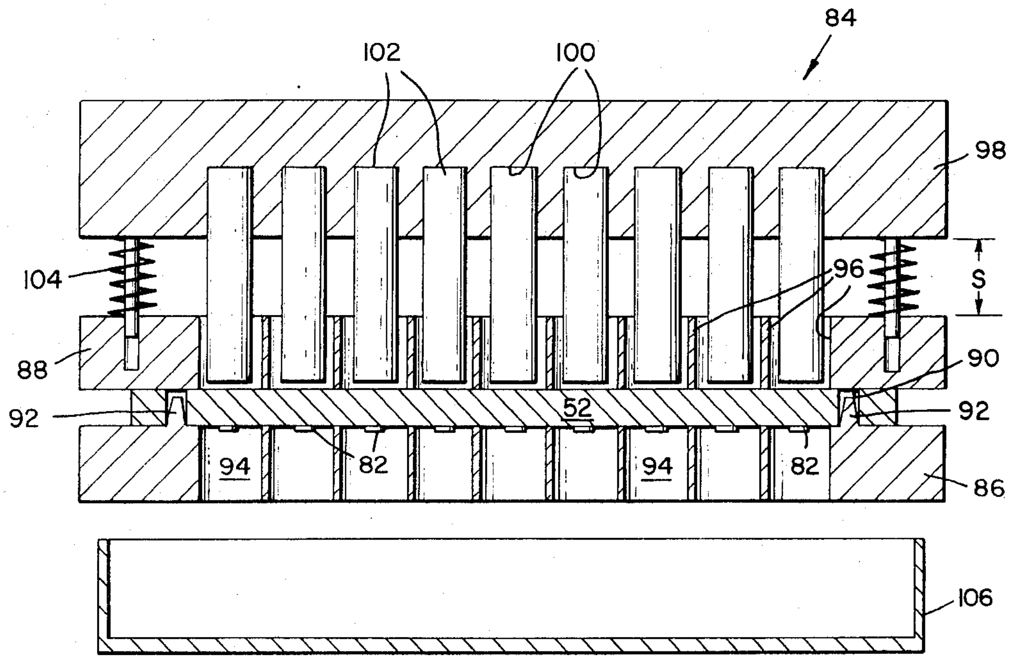
Figure 6:
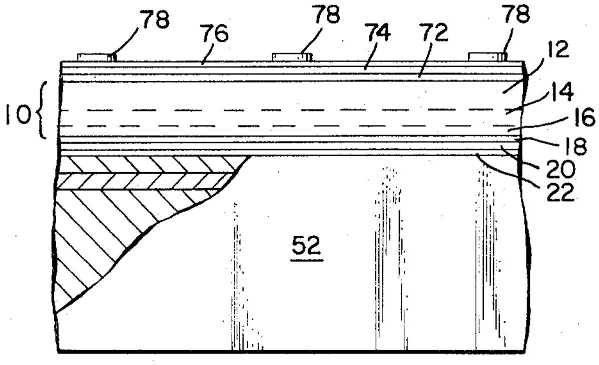
Figure 7:
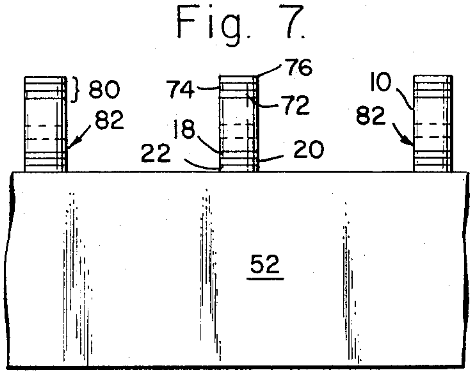
Figure 9:
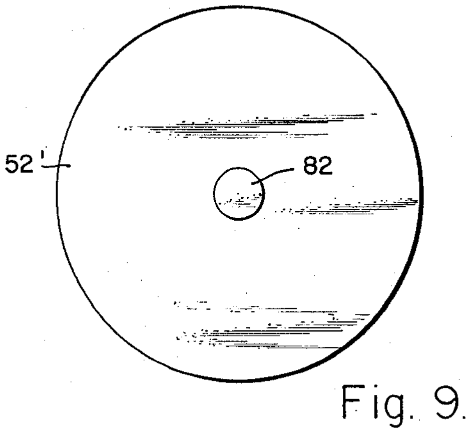

FIGS. 3*a* and 3*b* respectively depict the wafer of FIG. 2 in partial cross-section having a thinned substrate and the apparatus for thinning the wafer;

FIGS. 4*a* and 4*b* illustrate the step of bonding the thinned semiconductor wafer to a metal support plate in accordance with the present invention, FIG. 4*b* showing an enlarged view of the wafer, plate and block portion of FIG. 4a;

FIG. 5 shows the bonded wafer-metal support plate assembly with a portion of the wafer removed after the bonding operation of FIG. 4;

FIGS. 6 and 7 illustrate successive steps in fabricating an array of a plurality of tiny semiconductor elements disposed on a common face of the metal support plate;

FIG. 8 depicts the assembly of FIG. 7, positioned in a punch press prior to the punching out of separate sections from the metal support plate, each having a semiconductor element thereon;

FIG. 9 is a plan view of a single tiny semiconductor device assembly; and

Figure 10:
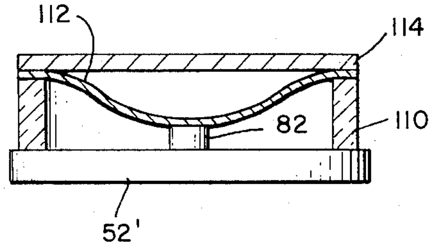

FIG. 10 is a side elevational view of a hermetically packaged semiconductor device.

In order to produce various kinds of devices such as PN diodes, PIN diodes, varactor diodes, IMPATT and TRAPATT diodes, triodes, etc., a wafer, for example, of silicon, gallium arsenide, and germanium, may at the outset contain regions of predetermined conductivity type. Although the wafer described herein comprises a specific *p+—n—n+* layer configuration, it is to be understood that other, differently doped wafers may be utilized in the inventive process. However, for purposes of clarity and simplication in explaining the process of the present invention, a specifically P+—n—n+ doped wafer will be utilized in the description of the preferred embodiment of the process.

Figure 1:
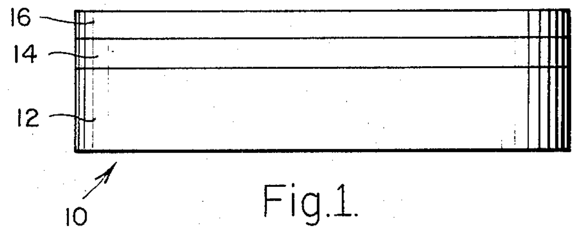
FIG. 1 depicts an exemplary doped silicon wafer preparatory to the processing steps of the present invention.

Accordingly, with reference to FIG. 1, a wafer 10 includes a thick *n+* substrate 12 almost as thick as the wafer, a thin *n* layer 14, and a thin *p+* layer 16. For purposes of illustration, layers 14 and 16 are shown greatly thickened. However, as examples of thicknesses utilized, substrate 12 is approximately 6 mils in thickness, layer 14 is 1 micron in thickness, and layer 16 is 12 microns in thickness. Alternatively, in a 7 mil thick wafer, the *n* and *p+* layers may be extremely thin, the *n* layer being typically about 1.4 microns in thickness and the *p+* layer being typically about 0.4 microns in thickness. The wafer is, for example, of general circular cross-section having a diameter of approximately 1.25 inches and one edge may be flattened for alignment purposes, although other cross-sectional configurations can be used. Such as-doped wafers are commercially obtainable, or may be otherwise doped by well-known processes, such as by diffusion and ion implantation.

As shown in FIG. 2, layer 16 is coated with a metal film comprising, for example, coatings 18, 20 and 22 of gold, platinum, and chromium or, if desired, platinum coating 20 may be replaced with a chromium-gold interface. Examples of thicknesses for the former are 10,000 A gold, 1,000 A platinum, and 800 A chromium. For the latter, gold layer 18 may be approximately 15 microns thick, platinum layer 20 may be approximately 200 A thick, and a chromium layer 22 about 600 A thick. Coatings 18, 20 and 22 are applied by standard evaporation techniques except that, after some of the gold of layer 22 has been evaporated in situ, further gold is added by electroplating to build up its thickness.

Wafer 10, as built and metallized, is then thinned at its unmetallized end surface 24 to form the configuration shown in FIG. 3*a* by a process utilizing the apparatus depicted in FIG. 3*b*. Wafer 10 is first affixed, by a wax, such as bees wax, to a disc 25, such as sapphire, which is not capable of being attacked by an etching solution utilized in the thinning process. The disc is affixed to surface 26 at the metallized side of the wafer containing coating 22. Such affixation may be effected by placing the wax between the wafer and the disc and by heating the two for a time and at a temperature sufficient to enable the wax to melt and the two to stick together upon cooling after the wax has melted. The secured together disc and wafer are then hand pressed into a holder 27, such as of "Teflon" (trademark of E. I. Du Pont de Nemours & Co.), the disc side being within the holder within an end recess 28 thereof. For this purpose, recess 28 is provided with width and depth dimensions which are substantially the same as those of the disc and wafer to permit substrate side 24 of the wafer to be flush with an end 29 of the holder.

A black wax, such as "Apiezon" (trademark of James G. Biddle Co.), (see also "The Condensed Chemical Dictionary," A. and E. Rose, Reinhold Publishing Corporation, 1969, 7th Ed.) is placed around the intersecting edges of the holder and the wafer substrate so as to produce a rim 30 which extends slightly onto the surface of the wafer substrate to form an exposed interior portion of surface 24.

The holder is then secured to the apparatus depicted in FIG. 3b by attaching it to a motor shaft 31 which is capable of being alternately rotated by a reversible motor 32. The end of the holder containing the waxed wafer is then placed within an etchant solution 34 contained within a receptacle 36. A plurality of "Teflon" baffles 38 are symmetrically placed around the holder. Below the receptacle is placed a magnetic stirrer 40. In order to maintain constant temperature of solution 34, a coolant 42, such as water, is placed around the receptacle and held within a container 44. The whole apparatus is supported on a base 46.

Solution 34 is an etching solution for removal of a portion of substrate 12 not masked by the black wax. The type of etchant utilized will, of course, depend upon the material of the substrate, all of which are well-known in the prior art. However, for purposes of illustration, the etching solution for silicon comprises 3 parts by volume of hydrogen fluoride, 5 parts by volume of nitric acid, and 3 parts by volume of acetic acid. For gallium arsenide, the etching solution may comprise 3 parts by volume sulphuric acid, 1 part by volume water, and one part by volume hydrogen peroxide. Germanium is etchable by a solution comprising 3 parts by volume hydrogen fluoride, 5 parts by volume nitric acid, 6 parts by volume of acetic acid, and 0.3 percent of the foregoing combination of bromine.

Motor 32 is caused to alternately rotate holder 27 and wafer 10 within solution 34 while the solution is magnetically stirred to obtain washing-machine-like agitation, in order to obtain a smooth, ungrooved, fine etch on the exposed portion of surface 24 of substrate 12. The speed of rotation and the period of reversing the direction of rotation of the motor is determined experimentally in accordance with the depth of etching and the quality thereof. In the etching of silicon, for example, motor 32 is caused to turn at 1,000 rpm with a reversal in direction of rotation every 1 minute for the first 5 mil etch. Thereafter, reversal is every 5 seconds for final control of etch. The water jacket cools the solution to maintain a constant temperature in order to overcome the heating of the solution by the etching process.

After etching, the holder and wafer are removed from the solution and rinsed in deionized water to remove remnants of the etchant. The disc and wafer are then removed from the holder and separated from one another. Any remaining wax on the wafer is removed with tetrachloroethylene and methyl alcohol. After drying, the etched wafer had the appearance as that illustrated in FIG. 3*a*, showing a thinned wafer 10 having an etched portion 48 and a rim 50. The purpose of the rim was to facilitate ease in further handling of the wafer since, at this time, the wafer had an approximate thickness of 10 microns ± 2 microns.

As shown in FIGS. 4*a* and 4*b*, wafer 10, as thinned, is then disposed in face-to-face relation on a copper plate 52, with metallized side 26 in contact therewith. The copper plate has a thickness of several mils and a diameter smaller than the wafer diameter between the periphery of rim 50. Typically, copper plate 52 is about 10 mils thick. It is to be understood that support plate 52 need not be made of copper but may be made of various suitable metals; but it is preferred to utilize commercially available; oxygen-free copper material for the plate in view of its excellent thermal and electrical conductivity.

The assembled wafer and plate are placed between opposed plates 54 and 56 of a manually operated hydraulic laboratory bench press 58 having heater filaments and water coolant lines within the plates. A stainless steel block 62, having a diameter less than wafer 10 to fit within rim 50, is placed on the substrate. Blocks 56 includes portions 64 and 66 having a ball bearing 67 arranged within spherical recesses 68 in the block portions to provide an adjustment for non-parallelism of block portion 64 and plate 54 and non-alignment of plate 52 and wafer 10. Lower press plate 54 is moved upward (as indicated by arrows 70) toward upper block 56 to press wafer 10 and plate 52 together. The wafer and copper plate are heated to a temperature less than the silicon-gold eutectic temperature while the wafer-plate assembly is under compression. In this way thermocompression bonding of wafer 10 to plate 52 is accomplished. Illustratively, the wafer-plate assembly can be thermocompression bonded by heating it to 200°C for about 20 to 30 minutes while exerting a pressure on the assembly of about 40,000 psi. It is preferred that the pressure not exceed 100,000 psi to prevent wafer damage. In practice, the temperature, pressure and time of the thermocompression step are variable to a considerable extent with continued satisfactory results. It is to be understood, however, that, although a particular thermocompression bonding step has been described, other bonding methods are as applicable as will become apparent to those skilled in the art. Examples are by ultrasonic bonding and plating.

After the wafer and plate have been bonded together, the periphery of the wafer including rim 50 is cracked off or otherwise removed to make the wafer diameter equal that of the plate, as depicted in FIG. 5.

Alternately, if wafer 10 is not pre-thinned, it is hand lapped and machine and chemically polished by well-known methods after affixation to plate 52 to remove most of $n^+$ substrate layer 12 and to reduce the wafer thickness to less than 50 microns. Illustratively, the wafer thickness is reduced to less than 10 microns with a minimum thickness somewhat greater than the combined thickness of *n* and *p* layers 14 and 16. The thus thinned wafer itself is quite fragile but, since it is affixed to plate 52, the combination presents no handling problems.

As illustrated in FIG. 6, a composite metal film is next deposited on the wafer in a suitable manner, such as evaporation and electro-deposition. Such a metal film comprises a layer 72 of chromium about 600 A thick, a layer 74 of chromium and gold about 200 A thick, and a layer 76 of gold about 10 microns thick.

The resultant film is covered with a film of photoresist, such as by "KTFR" (trademark of Eastman Kodak Co.). Such photoresist is selectively exposed to ultraviolet light through a suitably patterned exposure mask for a time sufficient to completely expose the unmasked photoresist. The exposed portions are developed in the "KTFR" developer and the undeveloped portions are removed by a "KTFR" rinse and xylene to provide an array of circular dots 78, about 3 to 6 mils diameter, as shown in FIG. 6. The diameter of dots 78 depends upon the desired size of the metal on element 10 to be retained, which, in turn, depends upon the frequency band at which the end product is to function. The dots are spaced from center to center by about 50 mils. The array of photoresist dots 78 constitutes an etching mask for the underlying metal film on the wafer. Thereafter, the metal film, except those portions under the dots 78, is etched away, using the dots to protect the underlying portions of the metal film against etching, to remove all of the metal film. In this etching process, the gold and the platinum are etched by a potassium iodide solution and the chromium is removed by hydrochloric acid at room temperature. The times for removal depend upon the thickness of the film. The dots are then removed by "J-100 (trademark of Indust-Ri-Chem Lab), a solvent, leaving behind metal film dots 80 on the wafer.

Next, portions of the silicon wafer, not protected by the metal dots previously formed, are etched away with an etchant, such as a mixture of 3 parts hydrofluoric acid, 5 parts nitric acid, and 6 parts acetic acid, using metal dots 80 as masks against the etching away of the silicon portions directly therebeneath so as to form many, typically upward of a hundred, disc-shaped tiny silicon section or members 82 as is generally depicted in FIG. 7. It is possible to provide silicon sections of mesa type configuration by performing other routine procedures starting with the thinned wafer 10 already bonded to the plate 52.

The resultant assembly is next placed in a punch press apparatus 84, as indicated in FIG. 8. The punch press is designed for simultaneously punching out many copper discs, typically about 40 to 50 mils diameter, from the copper plate in a single punching operation. Generally, the FIG. 7 assembly is disposed upside down between opposed apertured plates 86 and 88 of the punch press. Copper plate 52 is provided with a pair of alignment holes 90 which are used to align it to press plates 86 and 88 by registering alignment holes 90 with alignment bosses 92 formed on the press plate. Each press plate has a matching array of holes 94 and 96 corresponding in number and arrangement to the array of semiconductor elements 82 affixed to copper plate 52, except that holes 94 and 96 are typically of a diameter about 10 times as great as the diameter of the semiconductor elements.

The punch press also includes an additional plate 98 having an array of cylindrical holes 100 in its lowermost face into which an array of cylindrical pins 102 is fitted. The array of pins 102 project downwardly from plate 98 into holes 96 of plate 88. Each pin 102 is of a diameter slightly less than hole 96 into which it projects. Three compression springs 104, of which two are shown, are arranged symmetrically about the vertical axis of the press apparatus between plates 88 and 98. A receptacle 106 is disposed beneath the plate 86 for receiving parts punched from copper plate 52.

The punch press is operated by moving plate 98 vertically downward through an approximate vertical distance S, thereby causing pins 102 to punch out circular sections of copper from copper plate 52. The circular sections pass through holes 94 of plate 86 and are collected in receptacle 106. As a result, many identical small semiconductor device assemblies are simultaneously produced, each of which having the general appearance of the device assembly depicted in FIG. 9. In this figure there is shown a plan view of a tiny silicon element 82 which is centrally disposed on and bonded to a small copper plate member 52' which has been punched out of the much larger copper plate 52.

Instead of using a punch press apparatus in the manner described, copper plate 52 with the silicon elements thereon may be sawed or diced into many device assemblies, but the use of the punch press apparatus affords superior results in simply and economically providing circular copper plates 52' free of rough edges with a minimum of handling.

Hermetically packed silicon elements 82 may be provided by producing devices such as that illustrated in side sectional view of FIG. 10. In FIG. 10, a cylindrical quartz or ceramic ring 110, having suitably metallized upper and lower rims, is soldered to copper disc 52' to encircle element 82. The ring is typically about 10 mils high, is metallized on each rim with successive evaporated layers of chromium, molybdenum, copper, and gold, for example, and is soldered to disc 52' by a ring-shaped solder preform (e.g., of tin and gold) interposed therebetween which is solderable at a temperature below the eutectic temperature of silicon-gold. A gold ribbon 112, about 3 mils wide, is compression bonded at each end to the upper rim of the quartz ring 110 and at its middle to the metal film on the silicon element 82. A gold-clad molybdenum cap 114 is bonded to the quartz ring 110.

Alternately, a quartz standoff metallized on both sides can be soldered to copper section 52' and a gold ribbon bonded to the diode and the quartz standoff. During operation, the copper chip is soldered to a larger heat sink in any type of circuit and contact is made on the standoff rather than on the diode so that no pressure is applied to the diode itself. The capacitance of the quartz standoff and the strap as a "package" is typically 0.05 pf, thereby the package can be used at very high frequencies. Continuous-wave operation of 270mW has been achieved at 60.8 GHz with this type of device.

The DC to RF conversion efficiency of these devices nearly doubled from the diodes made from previous methods. At 60.8 GHz the efficiency is close to 3.5 percent with 270mW CW output and at 35 GHz, the efficiency is 6 percent with over 600 mW CW output. This result is mainly attributed to reduced series loss due to thinned silicon and also to better heat sinking because of better bonding. The thermal resistance measured is around 26°C/watt for a 50 micron junction and 10°C/watt for a 140 micron junction as compared to theoretical predictions of 24.5°C/watt and 9.8°C/watt respectively.

Although specific embodiments of the invention have been described, other embodiments, modifications and the like are intended to be encompassed within the scope of the invention.

What is claimed is:

1. A method for simultaneously fabricating a plurality of semiconductor devices from a metal plate and a semiconductor wafer comprising a two-faced substrate having a doped surface at one face and a second surface at the second face comprising the steps of:
- metallizing the doped surface of the wafer;
- affixing the wafer at its metallized surface to a disc of substantially the same circumferential configuration as that of the wafer by use of wax at a temperature and for a period of time to completely seal the wafer and the disc together at their matching surfaces;
- press fitting the wafer and the disc in one end of a holder having a recessed opening means in one end thereof, the recessed opening means having substantially the same circumferential configuration as that of the wafer and having a dimensional depth sufficient to align the second surface of the water flush with the holder end;
- sealing the holder end and the second surface of the wafer at the peripheral edge thereof with wax to expose only an interior portion of the second wafer surface, the interior portion having a surface area less than that of the wafer;
- uniformly etching the exposed interior portion in an etching solution by alternatively rotating the holder and stirring and agitating the solution to thin the interior portion, and to form a rim of substrate material protected by wax, the wax and the holder being of a material inert to the solution;
- removing the holder, the wafer and its thinned exposed portion from the solution and rinsing the same with deionized water;
- separating the thinned wafer from the holder, disc and wax;
- thermocompression bonding the thinned wafer at its metallized surface to a plate at a pressure of 40,000 psi at 200°C;
- removing the substrate rim from the wafer;
- placing a photoresist layer on the thinned wafer;
- removing selected portions of the masked layer of photoresist material to expose portions of the thinned wafer;
- etching the exposed portions of the thinned wafer to form individual semiconductor elements on the plate; and
- separating the semiconductor elements from one another by punching out sections of the plate.

2. A method for simultaneously fabricating a plurality of semiconductor devices comprising the steps of:
- thinning a portion of a semiconductor wafer for forming a thinned fragile interior surface portion and an unthinned portion supporting the thinned portion;
- affixing the thinned wafer to a plate;
- removing portions of the thinned wafer to form a plurality of semiconductor elements on the plate; and
- separating the plate about the semiconductor elements for forming the plurality of semiconductor devices comprising the semiconductor elements secured to separated sections of the plate.

3. A method as in claim 2 wherein said thinning step comprises the step of:
- etching an interior portion of one surface of the wafer to provide a peripheral rim configured as the unthinned portion surrounding, bounding and supporting the fragile interior surface portion.

4. A method for making semiconductor devices comprising the steps of:
- forming a metal film on one of two faces of a wafer of semiconductor material;
- thinning the wafer at the interior of the other wafer face while leaving exterior portions thereof intact for forming a thinned wafer having thickened edge portions for support of the thinned interior thereof;
- bonding the thinned wafer at the one face to a plate;
- forming the thinned wafer into many separate, tiny, laterally spaced wafer sections; and
- simultaneously separating the plate into separate plate sections each having a wafer section secured thereto.

5. The method set forth in claim 4 wherein said wafer thinning step comprises the step of selectively etching the wafer material.

6. The method set forth in claim 4 wherein said wafer-plate bonding step comprises the step of heating the wafer and the plate to a predetermined temperature under pressure.

7. The method set forth in claim 4 wherein said wafer-plate bonding step comprises the step of heating the wafer and the plate to a temperature of about 200°C and pressing the wafer and the plate together with a pressure of about 40,000 pounds per square inch.

8. The method set forth in claim 6 wherein said heating step comprises the step of heating the wafer and the plate to a temperature less than the eutectic temperature of the semiconductor material of the wafer and of the material of the metal film formed on the face of the wafer.

9. The method set forth in claim 4 wherein said plate separating step comprises the step of forming hole means in the plate surrounding the wafer sections to obtain the plate sections each having the wafer section thereon.

10. The method set forth in claim 4 wherein said plate separating step comprises the step of simultaneously punching the plate sections from the plate.

11. The method set forth in claim 4 wherein the wafer is selected from the materials consisting of silicon, germanium, and gallium arsenide, and the metal film formed on the waffer's face is selected from a layer consisting of the combination of chromium and gold, and gold and the combination of chromium, platinum, and gold.

12. A method as in claim 2 wherein said step of simultaneously separating the plate into a plurality of sections about each of the semiconductor elements comprises the step of punching out the sections of the plate.

13. A method as in claim 12 wherein said punching out step comprises the steps of placing the elements on the plate in a punch press with the elements aligned in and with means defining holes in a punch plate and simultaneously moving a plurality of punch pins against the plate having the elements therein to cause the sections to be formed as the pins force portions of the plate having the elements thereon through the hole means.

14. A method for simultaneously fabricating a plurality of semiconductor devices comprising the steps of:

A. fabricating a plurality of semiconductor elements on a plate by
   1. thinning a semiconductor wafer by
      a. affixing the wafer to a disc of substantially the same circumferential configuration as that of the wafer to completely seal the wafer and the disc together at their matching surfaces,
      b. fitting the wafer and the discs in one end of a holder,
      c. sealing the wafer to the holder to expose only an interior portion of one surface of the wafer, the interior portion having a surface area less than that of the wafer, and
      d. uniformly etching the exposed interior portion in an etching solution to thin the interior portion and to form a rim of substrate material; and
   2. affixing the thinned wafer to the plate; and
   3. removing portions of the thinned wafer to form the plurality of semiconductor elements; and
B. simultaneously separating the plate into a plurality of sections about each of the semiconductor elements.

15. A method as in claim 2 further including the step of removing the unthinned portion after said affixing step.

* * * * *